(12) United States Patent
Oh et al.

(10) Patent No.: US 9,117,700 B2
(45) Date of Patent: Aug. 25, 2015

(54) 3-D NONVOLATILE MEMORY DEVICES AND METHODS OF MANUFACTURING THE SAME

(75) Inventors: Sang Hyun Oh, Anyang-si (KR); Seiichi Aritome, Seongnam-si (KR); Sang Bum Lee, Incheon (KR)

(73) Assignee: SK Hynix Inc., Gyeonggi-do (KR)

( * ) Notice: Subject to any disclaimer, the term of this patent is extended or adjusted under 35 U.S.C. 154(b) by 496 days.

(21) Appl. No.: 13/601,531

(22) Filed: Aug. 31, 2012

(65) Prior Publication Data

US 2013/0107602 A1   May 2, 2013

(30) Foreign Application Priority Data

Oct. 26, 2011  (KR) ........................ 10-2011-0109947

(51) Int. Cl.
*G11C 5/02* (2006.01)
*H01L 27/115* (2006.01)
*H01L 21/822* (2006.01)
*G11C 16/04* (2006.01)
*G11C 16/14* (2006.01)

(52) U.S. Cl.
CPC ...... *H01L 27/11556* (2013.01); *G11C 16/0408* (2013.01); *G11C 16/14* (2013.01); *H01L 21/8221* (2013.01); *H01L 27/1157* (2013.01); *H01L 27/11524* (2013.01); *H01L 27/11578* (2013.01); *H01L 27/11582* (2013.01)

(58) Field of Classification Search
USPC ........ 365/185.05, 185.08, 185.17, 51, 63, 72, 365/174; 257/E27.06, E21.409, 368; 438/301
See application file for complete search history.

(56) References Cited

U.S. PATENT DOCUMENTS

| | | | | |
|---|---|---|---|---|
| 2005/0265109 | A1* | 12/2005 | Goda et al. | 365/230.06 |
| 2010/0149886 | A1* | 6/2010 | Song et al. | 365/189.15 |
| 2011/0090737 | A1* | 4/2011 | Yoo et al. | 365/185.11 |
| 2012/0003800 | A1* | 1/2012 | Lee et al. | 438/261 |
| 2012/0049267 | A1* | 3/2012 | Jung | 257/324 |

FOREIGN PATENT DOCUMENTS

KR   1020100100396 A   9/2010

* cited by examiner

*Primary Examiner* — Fernando Hidalgo
(74) *Attorney, Agent, or Firm* — William Park & Associates Ltd.

(57) ABSTRACT

A three-dimensional (3-D) nonvolatile memory device includes a channel layer protruded from a substrate, a plurality of memory cells stacked along the channel layer, a source line coupled to the end of one side of the channel layer, a bit line coupled to the end of the other side of the channel layer, a first junction interposed between the end of one side of the channel layer and the source line and configured to have a P type impurity doped therein, and a second junction interposed between the end of the other side of the channel layer and the bit line and configured to have an N type impurity doped therein.

18 Claims, 17 Drawing Sheets

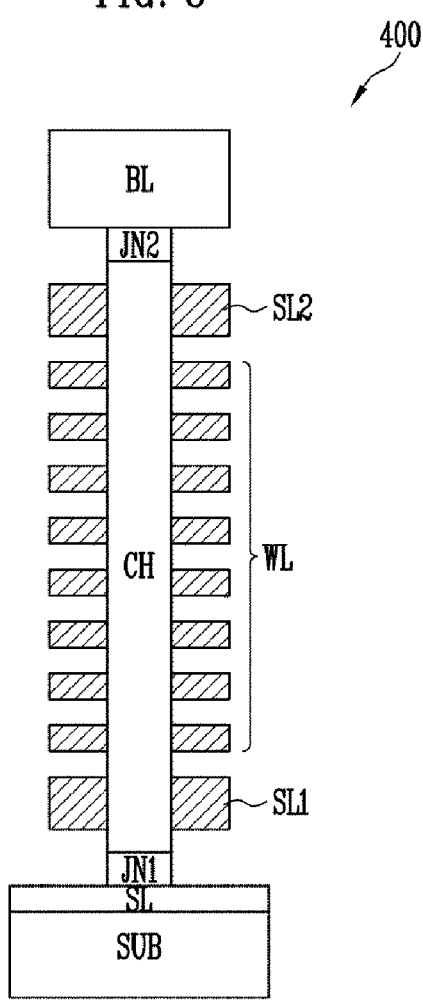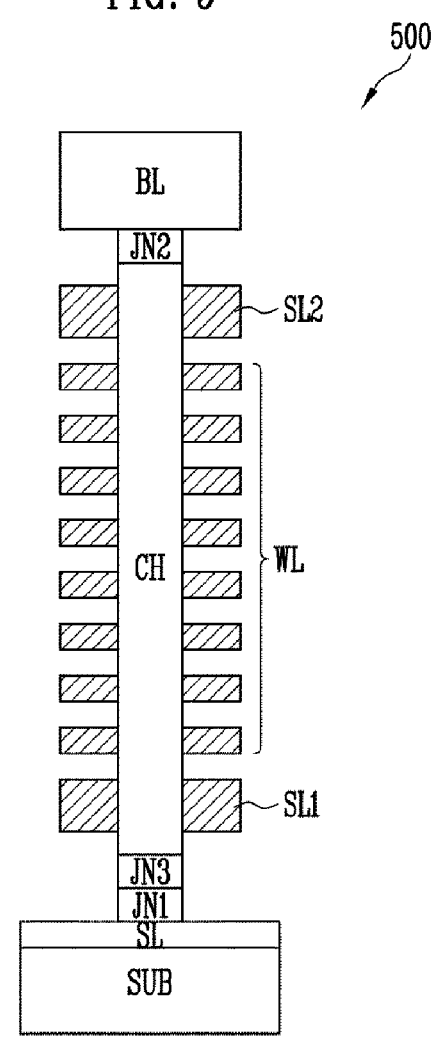

3-D NONVOLATILE MEMORY DEVICES AND METHODS OF MANUFACTURING THE SAME

CROSS-REFERENCE TO RELATED APPLICATION

Priority to Korean patent application number 10-2011-0109947 filed on Oct. 26, 2011, the entire disclosure of which is incorporated by reference herein, is claimed.

BACKGROUND

1. Technical Field

Embodiments of this disclosure relate to semiconductor devices and methods of manufacturing the same and, more particularly, to nonvolatile memory devices having three-dimensional (3-D) structures and methods of manufacturing the same.

2. Related Art

A nonvolatile memory device retains data stored therein although the supply of power is cut off. As the recent improvement of the degree of integration of 2-D memory devices in which memory cells may be formed in a single layer over a silicon substrate reaches the limit, there is proposed a 3-D nonvolatile memory device in which memory cells are vertically stacked in multiple layers from a silicon substrate.

The structure of a known 3-D nonvolatile memory device and problems thereof are described in detail below.

FIG. 1 is a cross-sectional view showing the structure of a known 3-D nonvolatile memory device.

As shown in FIG. 1, the known 3-D nonvolatile memory device includes a channel layer CH vertically protruded from a substrate 10 equipped with a source region 'source' and a lower select gate LSG, a plurality of memory cells MC, and the upper select gate USG stacked along the channel layer CH. The plurality of memory cells MC is coupled in series between the lower select gate LSG and the upper select gate USG, thus forming one string. The strings are vertically arranged from the substrate 10.

In FIG. 1, reference numeral '11' denotes an interlayer insulating layer, reference numeral '12' denotes a word line, reference numeral '13' denotes a lower select line, and reference numeral '14' denotes an upper select line. Furthermore, reference numeral '15' denotes a gate insulating layer, and reference numeral '16' collectively denotes a tunnel insulating layer, a memory layer, and a charge blocking layer.

In the known 3-D nonvolatile memory device constructed as above, an N type impurity is doped into the channel layer CH and the source region 'source'. Accordingly, when an erase operation is performed, the source region 'source' generates gate induced drain leakage (GIDL) current and holes generated by the GIDL current are injected into a memory layer.

The known 3-D nonvolatile memory device is problematic in that the erase speed is slow because the number of holes generated by the GIDL current is insufficient and the erase speed is lowered because sufficient holes are not supplied to some of the memory cells. In particular, in the known 3-D nonvolatile memory device, since the strings are vertically arranged from the substrate 10, the supply of holes becomes more difficult as the length of the channel layer CH increases. As a result, the speed of an erase operation is further reduced, and thus the memory device has poor performance.

BRIEF SUMMARY

An embodiment of this disclosure provides a 3-D nonvolatile memory device and a method of manufacturing the same which can secure an erase characteristic by generating a sufficient number of holes when an erase operation is performed.

In an aspect, a 3-D nonvolatile memory device includes a channel layer protruded from a substrate, a plurality of memory cells stacked along the channel layer, a source line coupled to the end of one side of the channel layer, a bit line coupled to the end of the other side of the channel layer, a first junction interposed between the end of one side of the channel layer and the source line and configured to have a P type impurity doped therein, and a second junction interposed between the end of the other side of the channel layer and the bit line and configured to have an N type impurity doped therein.

In another aspect, a method of manufacturing a 3-D nonvolatile memory device includes forming a plurality of memory cells that are stacked along a channel layer protruded from a substrate, forming a first junction coupled to the end of one side of the channel layer and configured to have a P type impurity doped therein, forming a second junction coupled to the end of the other side of the channel layer and configured to have an N type impurity doped therein, forming a source line coupled to the first junction, and forming a bit line coupled to the second junction.

BRIEF DESCRIPTION OF THE DRAWINGS

FIG. 8 is a cross-sectional view showing the structure of a 3-D nonvolatile memory device according to a fourth embodiment of this disclosure;

FIG. 9 is a cross-sectional view showing the structure of a 3-D nonvolatile memory device according to a fifth embodiment of this disclosure;

DESCRIPTION OF EMBODIMENTS

Hereinafter, various embodiments of the present disclosure will be described in detail with reference to the accompanying drawings. The figures are provided to allow those having ordinary skill in the art to understand the scope of the embodiments of the disclosure.

Figure 1:
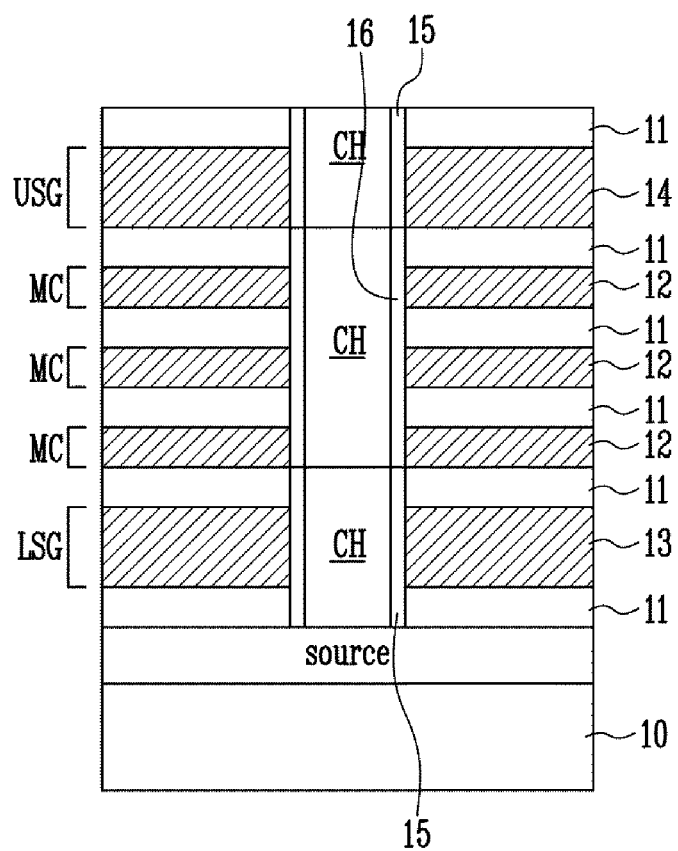
FIG. 1 is a cross-sectional view showing the structure of a known 3-D nonvolatile memory device.
Figure 2:
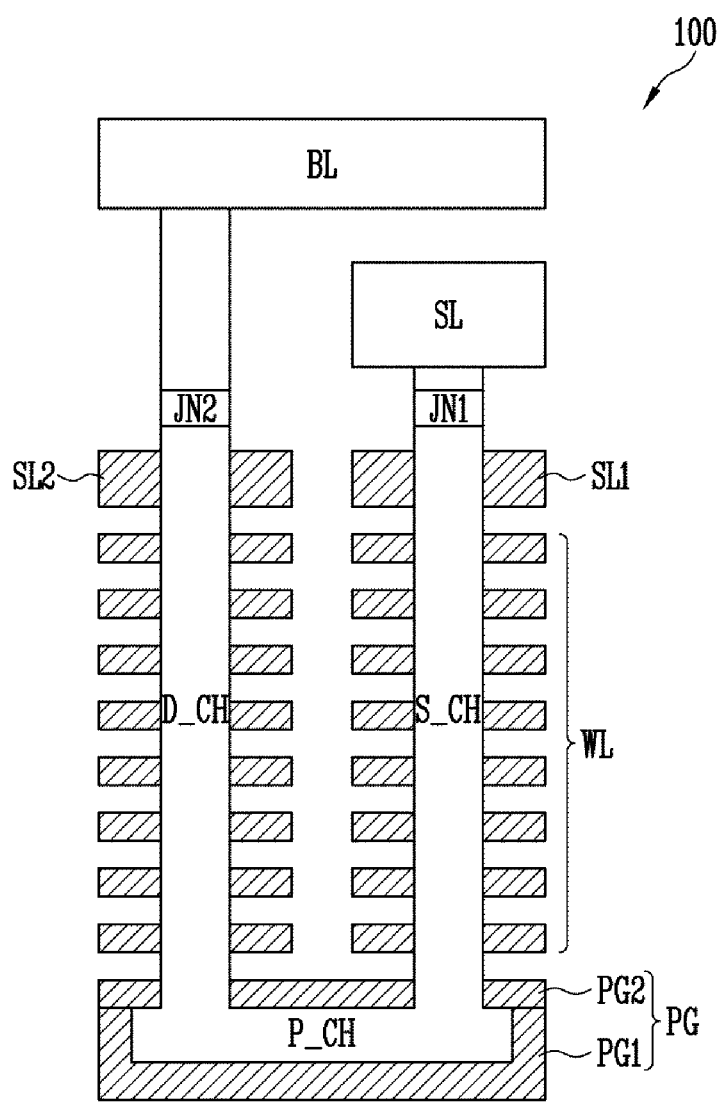
FIG. 2 is a cross-sectional view showing the structure of a 3-D nonvolatile memory device according to a first embodiment of this disclosure.

FIG. 2 is a cross-sectional view showing the structure of a 3-D nonvolatile memory device according to a first embodiment of this disclosure. In this figure, only a plurality of word lines, first and second select lines, a bit line, and a source line are chiefly illustrated, and an interlayer insulating layer interposed between the lines is not shown, for convenience of description.

As shown in FIG. 2, the 3-D nonvolatile memory device 100 according to the first embodiment of this disclosure may include a channel layer (P_CH, S_CH, and D_CH) protruded from a substrate and a plurality of memory cells stacked along the channel layer (P_CH, S_CH, and D_CH). Each of strings may be formed substantially in a U form.

The channel layer (P_CH, S_CH, and D_CH) may include a pipe channel layer P_CH buried in a pipe gate PG and a pair of a source-side channel layer S_CH and a drain-side channel layer D_CH coupled to the pipe channel layer P_CH and protruded from the pipe gate PG. The pipe gate PG may consist of only a first pipe gate PG1 in which the pipe channel layer P_CH may be formed or may consist of the first pipe gate PG1 and a second pipe gate PG2 formed on the first pipe gate PG1 so that the second pipe gate PG2 substantially covers the pipe channel layer P_CH. If the second pipe gate PG2 is further formed, the performance of the 3-D nonvolatile memory device can be improved because cell current is increased.

The 3-D nonvolatile memory device 100 further may include a plurality of word lines WL stacked over the pipe gate PG, a source line SL coupled to the end of one side of the channel layer (P_CH, S_CH, and D_CH), and a bit line BL coupled to the end of the other side of the channel layer (P_CH, S_CH, and D_CH).

The 3-D nonvolatile memory device 100 further may include a first junction JN1 interposed between the end of one side of the channel layer (P_CH, S_CH, and D_CH) and the source line SL and configured to have a P type impurity doped therein and a second junction JN2 interposed between the end of the other side of the channel layer (P_CH, S_CH, and D_CH) and the bit line BL and configured to have an N type impurity doped therein.

The 3-D nonvolatile memory device 100 further may include at least one first select line SL1 and at least one second select line SL2 which may be formed over the plurality of word lines. Here, a first select gate may be disposed between the first junction JN1 and a memory cell formed at the end of one side of the channel layer (P_CH, S_CH, and D_CH), and a second select gate may be disposed between the second junction JN2 and a memory cell formed at the end of the other side of the channel layer (P_CH, S_CH, and D_CH). FIG. 2 shows an example in which one string may include one first select gate and one second select gate (not shown).

The first junction JN1 may be partially overlapped with the first select gate or may be formed at a position where it is spaced apart from the first select gate. Furthermore, the second junction JN2 may be partially overlapped with the second select gate or may be formed at a position where it is spaced apart from the second select gate.

Figure 3A:
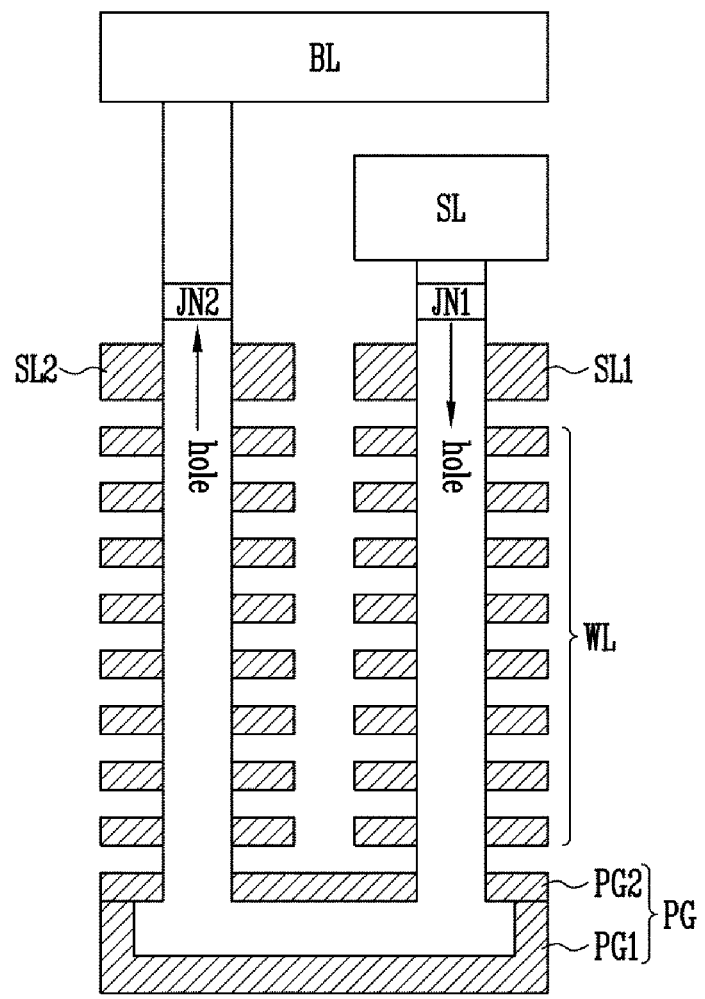
FIGS. 3A and 3B are a cross-sectional view and circuit diagram illustrating the erase operation of the 3-D nonvolatile memory device according to the first embodiment of this disclosure.
Figure 3B:
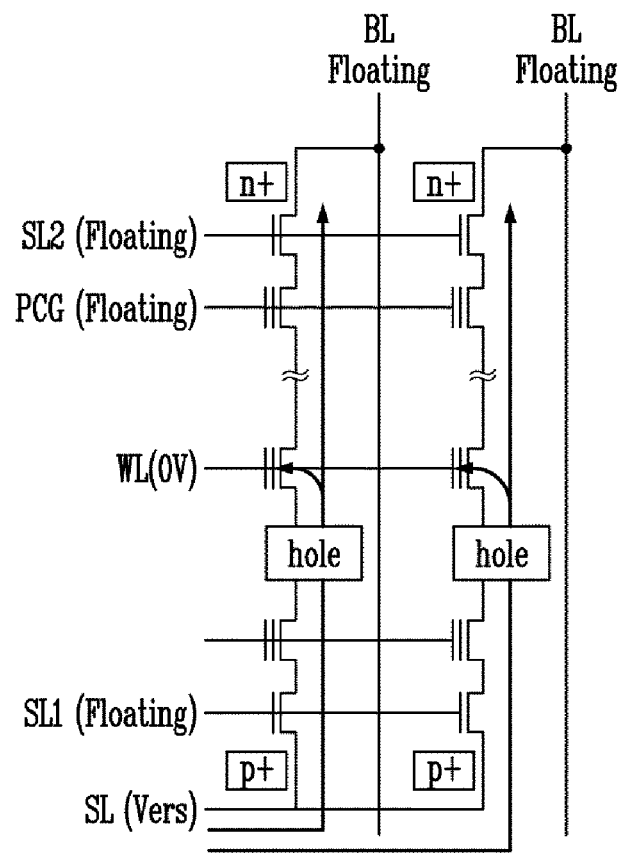

FIGS. 3A and 3B are a cross-sectional view and circuit diagram illustrating the erase operation of the 3-D nonvolatile memory device according to the first embodiment of this disclosure.

As shown in FIGS. 3A and 3B, when an erase operation is performed, 0 V may be applied to the plurality of word lines WL of a selected memory block and an erase voltage Vers may be applied to the source line SL, so that holes are supplied from the first junction JN1 to the channel layer (P_CH, S_CH, and D_CH). Accordingly, a sufficient number of holes can be stably supplied from the first junction JN1 to the channel layer (P_CH, S_CH, and D_CH). The supplied holes may be moved along the channel layer (P_CH, S_CH, and D_CH) and injected into the memory layers of respective memory cells, thereby completing the erase operation.

Here, the first select line SL1, the second select line SL2, the pipe gate PG, and the bit line BL are in a floating state. That is, the first select gate, the second select gate, and the pipe gate may be floated.

Figure 4A:
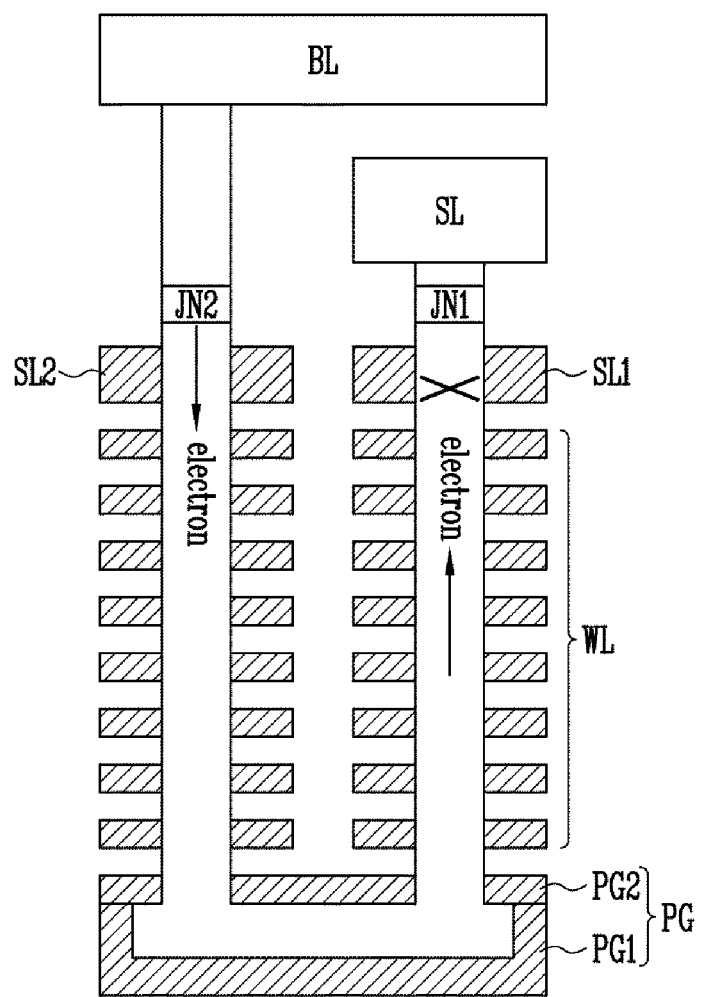
FIGS. 4A and 4B are a cross-sectional view and circuit diagram illustrating the program operation of the 3-D nonvolatile memory device according to the first embodiment of this disclosure.
Figure 4B:
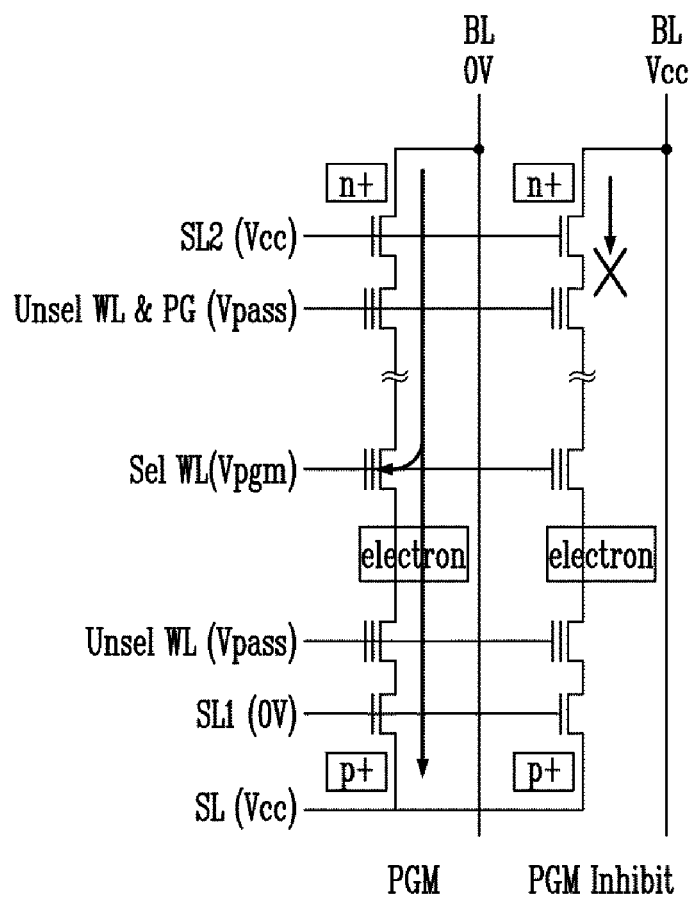

FIGS. 4A and 4B are a cross-sectional view and circuit diagram illustrating the program operation of the 3-D nonvolatile memory device according to the first embodiment of this disclosure.

As shown in FIGS. 4A and 4B, when a program operation is performed, a program voltage Vpgm may be applied to a selected word line Sel WL and a pass voltage Vpass may be applied to unselected word lines Unsel WL and the pipe gate PG. Here, 0 V may be applied to a bit line BL to which a memory cell (data '0') to be programmed is coupled. In contrast, an operating voltage Vcc may be applied to a bit line BL to which memory cells (data '1') not to be programmed may be coupled so that the memory cells (data '1') are prevented from being programmed by boosting the channel layer (that is, PGM inhibit).

Furthermore, 0 V may be applied to the first select line SL1, and the operating voltage Vcc may be applied to the second select line SL2. That is, the first select gate is made turned off so that the channel layer (P_CH, S_CH, and D_CH) may be separated from the first junction JN1. The operating voltage Vcc may be applied to the second select gate. That is, the second select gate is made turned on so that electrons are supplied from the second junction JN2 to the channel layer (P_CH, S_CH, and D_CH).

Figure 5A:
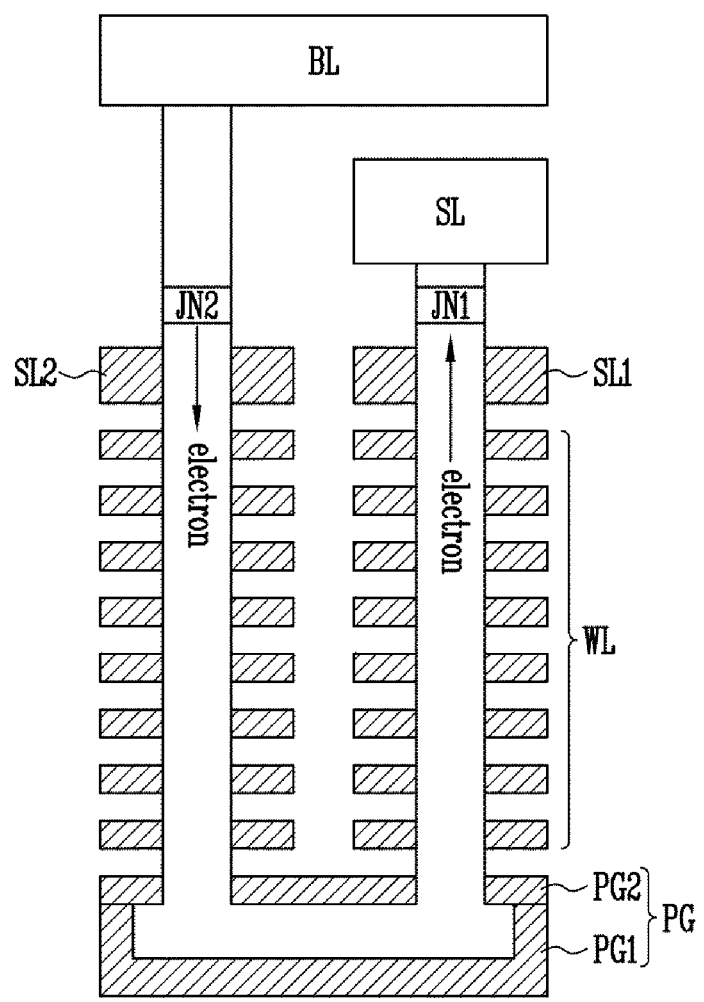
FIGS. 5A and 5B are a cross-sectional view and circuit diagram illustrating the read operation of the 3-D nonvolatile memory device according to the first embodiment of this disclosure.
Figure 5B:
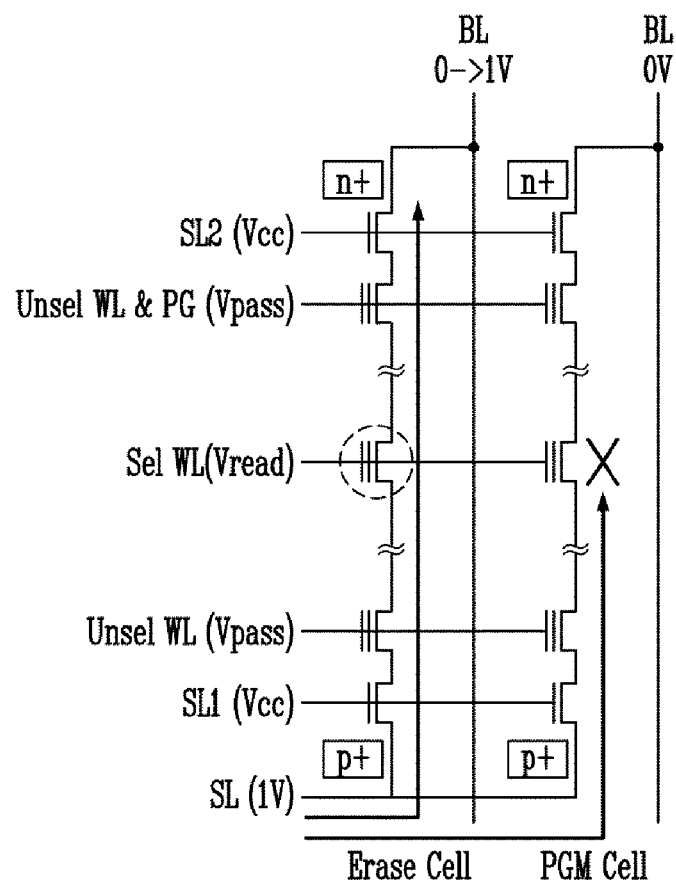

FIGS. 5A and 5B are a cross-sectional view and circuit diagram illustrating the read operation of the 3-D nonvolatile memory device according to the first embodiment of this disclosure.

As shown in FIGS. 5A and 5B, when a read operation is performed, a read voltage Vread may be applied to the selected word line Sel WL of a selected page. Here, the read voltage Vread has a level that turns on or off a memory cell depending on whether the memory cell has been programmed or not. If the memory cell has been programmed (data '0'), the read voltage Vread has a level that turns off the memory cell. If the memory cell has been erased (data '1'), the read voltage Vread has a level that turns on the memory cell. Furthermore, a pass voltage Vpass may be applied to unselected word lines Unsel WL and the pipe gate PG. Here, the pass voltage Vpass has a level that turns on all the memory cells irrespective of whether the memory cells have been programmed or not.

Furthermore, the bit line BL may be applied with a precharge voltage and then floated. The source line SL may be applied with voltage higher than the precharge voltage in order to sense whether the voltage level of the bit line BL becomes higher than the precharge voltage. For example, in the state in which the bit line BL is precharged to 0 V and then floated, 1 V may be applied to the source line SL in order to sense whether the voltage level of the bit line BL is higher than 0 V. If the voltage level of the bit line BL is higher than 0 V, a corresponding memory cell is in an erase state (data '1'). If the voltage level of the bit line BL is not higher than 0 V, the corresponding memory cell is in a program state (data '0').

Figure 6:
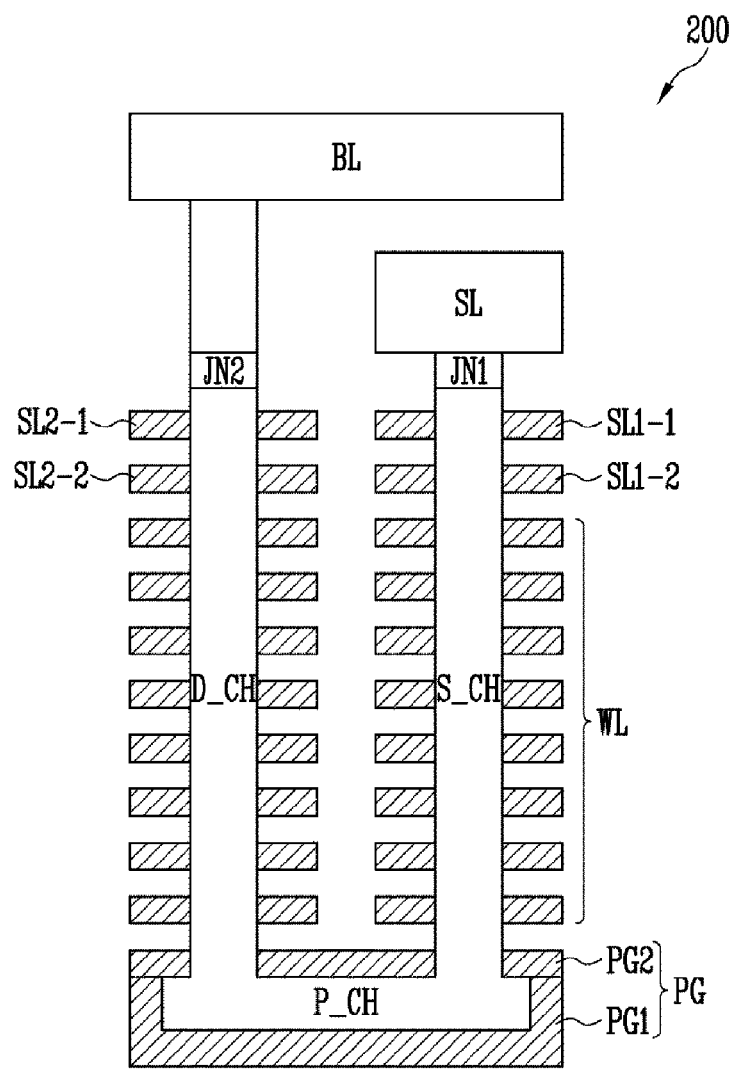
FIG. 6 is a cross-sectional view showing the structure of a 3-D nonvolatile memory device according to a second embodiment of this disclosure.

FIG. 6 is a cross-sectional view showing the structure of a 3-D nonvolatile memory device according to a second embodiment of this disclosure. In this figure, only a plurality of word lines, first and second select lines, a bit line, and a source line are chiefly illustrated, and an interlayer insulating layer interposed between the lines is not shown, for convenience of description.

As shown in FIG. 6, in the 3-D nonvolatile memory device 200 according to the second embodiment of this disclosure, each of strings may be formed substantially in a U form, and a plurality of memory cells coupled in series between two first select transistors and two second select gates forms each of the strings. The remaining elements of the 3-D nonvolatile memory device 200 according to the second embodiment are the same as those of the 3-D nonvolatile memory device 100 according to the first embodiment.

If two first select lines SL1-1 and SL1-2 and two second select lines SL2-1 and SL2-2 may be formed as in the present embodiment, an error in a read operation can be minimized.

For example, if one first select line and one second select line may be formed, when an operating voltage Vcc may be applied to a select gate in a read operation, a PN diode may be formed in the channel layer between the source line and the select line. Here, a forward bias may be applied across the PN diode because 1 V may be applied to the source line, thereby making it difficult to turn off the first select line.

In accordance with the second embodiment, the first select lines SL1-1 and SL1-2 and the second select lines SL2-1 and SL2-2 may be formed, and a turn-on voltage (for example, 5 V) may be applied in a read operation by using the upper select lines SL1-1 and SL2-1 as dummy lines. Here, the turn-on voltage refers to voltage that may turn on the gate. In this case, the first select line SL1-2 can be easily turned off because a reverse bias may be applied across the PN diode.

Conditions of an erase operation and a program operation in the 3-D nonvolatile memory device according to the second embodiment are the same as those in the first embodiment. The upper and lower select lines are operated in the same manner. That is, the same bias may be applied to the two first select lines SL1-1 and SL1-2, and the same bias may be applied to the two second select lines SL2-1 and SL2-2.

Furthermore, in a read operation, the turn-on voltage may be applied to the upper select lines SL1-1 and SL2-1, and the remaining conditions are the same as those of the first embodiment.

Figure 7:
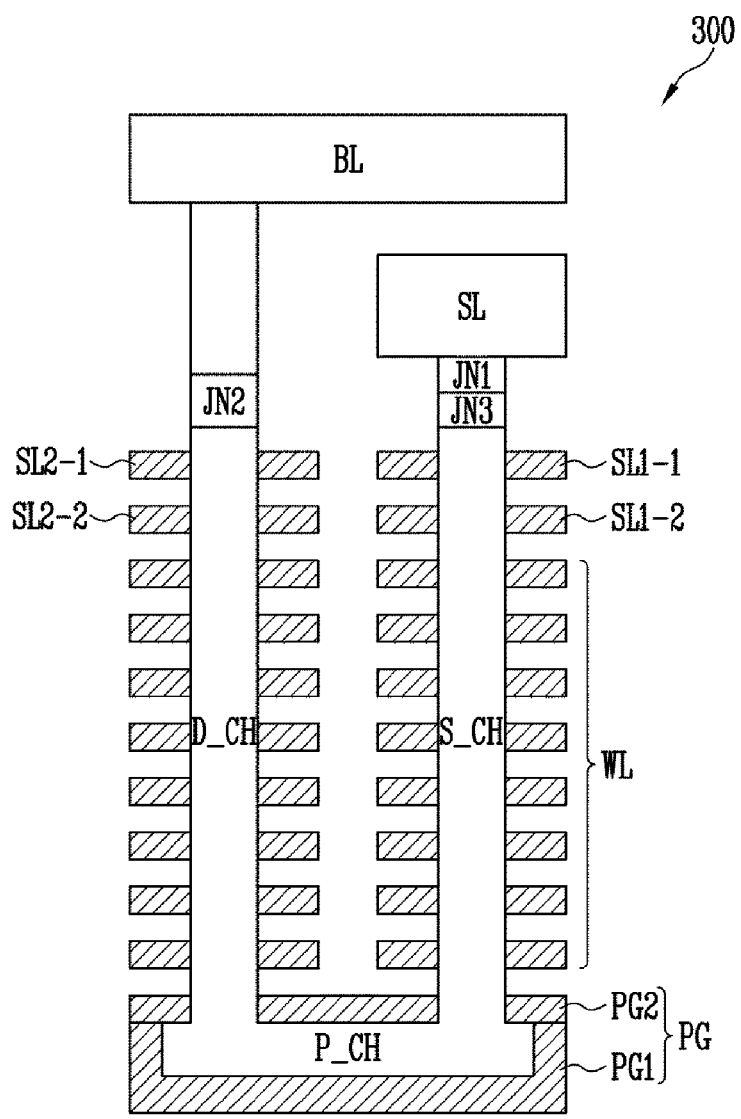
FIG. 7 is a cross-sectional view showing the structure of a 3-D nonvolatile memory device according to a third embodiment of this disclosure.

FIG. 7 is a cross-sectional view showing the structure of a 3-D nonvolatile memory device according to a third embodiment of this disclosure. In this figure, only a plurality of word lines, first and second select lines, a bit line, and a source line are chiefly illustrated, and an interlayer insulating layer interposed between the lines is not shown, for convenience of description.

As shown in FIG. 7, the 3-D nonvolatile memory device 300 according to the third embodiment of this disclosure may include strings each formed in a U form and a third junction JN3 interposed between the end of one side of channel layer (P_CH, S_CH, and D_CH), forming the U form, and a first junction JN1 and configured to have an N type impurity doped therein. The remaining elements of the third embodiment have the same construction as those of the 3-D nonvolatile memory device 200 according to the second embodiment.

The 3-D nonvolatile memory device according to the third embodiment may be driven on the same conditions as those of the second embodiment.

FIG. 8 is a cross-sectional view showing the structure of a 3-D nonvolatile memory device according to a fourth embodiment of this disclosure. In this figure, only a plurality of word lines, first and second select lines, a bit line, and a source line are chiefly illustrated, and an interlayer insulating layer interposed between the lines is not shown, for convenience of description.

As shown in FIG. 8, the 3-D nonvolatile memory device 400 according to the fourth embodiment of this disclosure may include strings substantially vertically arranged from a substrate SUB. A source line SL, at least one first select line SL1, a plurality of word lines WL, at least one second select line SL2, and a bit line BL may be sequentially provided over the substrate SUB. Furthermore, a first junction JN1 into which a P type impurity has been doped may be disposed between the source line SL and the end of one side (that is, bottom) of a channel layer CH protruded from the substrate SUB. A second junction JN2 into which an N type impurity has been doped may be disposed between the bit line BL and the end of the other side (that is, top) of the channel layer CH.

The first junction JN1 may be separated from or overlapped with the gate of the first select line SL1, and the second junction JN2 may be separated from or overlapped with the gate of the second select line SL2.

FIG. 9 is a cross-sectional view showing the structure of a 3-D nonvolatile memory device according to a fifth embodiment of this disclosure. In this figure, only a plurality of word lines, first and second select lines, a bit line, and a source line are chiefly illustrated, and an interlayer insulating layer interposed between the lines is not shown, for convenience of description.

As shown in FIG. 9, the 3-D nonvolatile memory device 500 according to the fifth embodiment of this disclosure may include strings substantially vertically arranged from a substrate SUB and a third junction JN3 disposed between the end of one side (that is, bottom) of a channel layer CH and a first junction JN1 and configured to have an N type impurity doped therein. The remaining elements of the 3-D nonvolatile memory device 500 have the same construction as those of the 3-D nonvolatile memory device 400 according to the fourth embodiment.

Additionally, in the drawings according to the first to fifth embodiments, a tunnel insulating layer, a memory layer, and a charge blocking layer are not shown. The tunnel insulating layer, the memory layer, and the charge blocking layer are interposed between the channel layer and the word lines. For example, the tunnel insulating layer, the memory layer, and the charge blocking layer may be formed to substantially surround the channel layer.

Furthermore, in the drawings according to the first to fifth embodiments, an example in which the channel layer are fully buried up to the central region of the trench has been described. In various embodiments, after forming the channel layer so that the central region of the trench is opened, an insulating layer may be filled in the opened central region or the channel layer may be formed by combining the open type and the burial type. For example, the channel layer of the memory cells may be formed so that the central region of the channel layer is opened, and the channel layer of the select transistor may be fully opened up to the central region.

Figure 10:
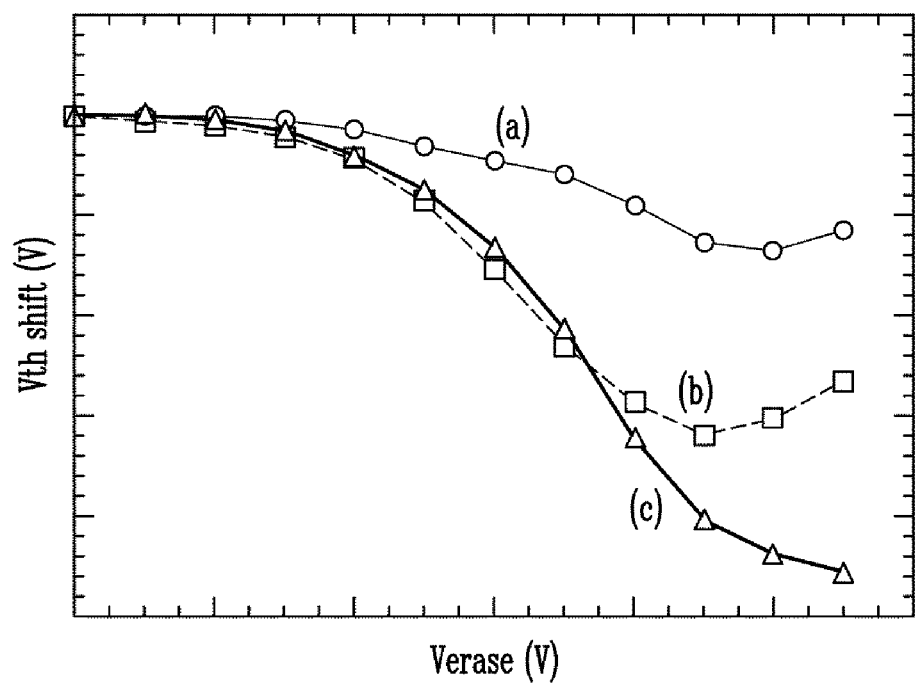
FIG. 10 is a graph showing the erase characteristics of the nonvolatile memory devices according to the first and the second embodiments of this disclosure.

FIG. 10 is a graph showing the erase characteristics of the nonvolatile memory devices according to the first and the second embodiments of this disclosure. In this figure, an X axis indicates an erase voltage Verase, and a Y axis indicates a shift in the threshold voltage (Vth shift).

In the graph, (a) indicates the erase characteristic of the known 3-D nonvolatile memory device and shows that an N type impurity has been doped into the channel layer. (b) and (c) indicate the erase characteristics of the 3-D nonvolatile memory devices according to the first and the second embodiments of this disclosure, respectively.

From the graph, it can be seen that the threshold voltages of memory cells are not sufficiently shifted in the known nonvolatile memory device when an erase operation is performed. This is because holes are not sufficiently supplied owing to GIDL current. In contrast, it can be seen that the threshold voltages of memory cells may be sufficiently shifted when an erase operation is performed in the first and third embodiments of this disclosure. This shows that a sufficient number of holes are supplied from the first junction when the erase operation is performed.

Figure 11A:
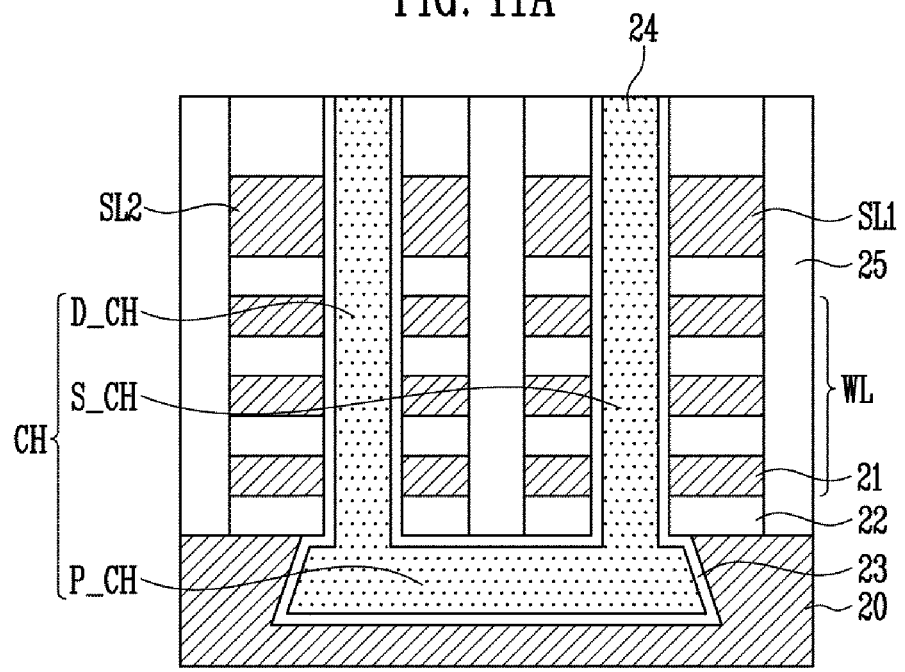
FIGS. 11A to 11C are cross-sectional views illustrating a method of manufacturing a 3-D nonvolatile memory device according to a sixth embodiment of this disclosure.
Figure 11B:
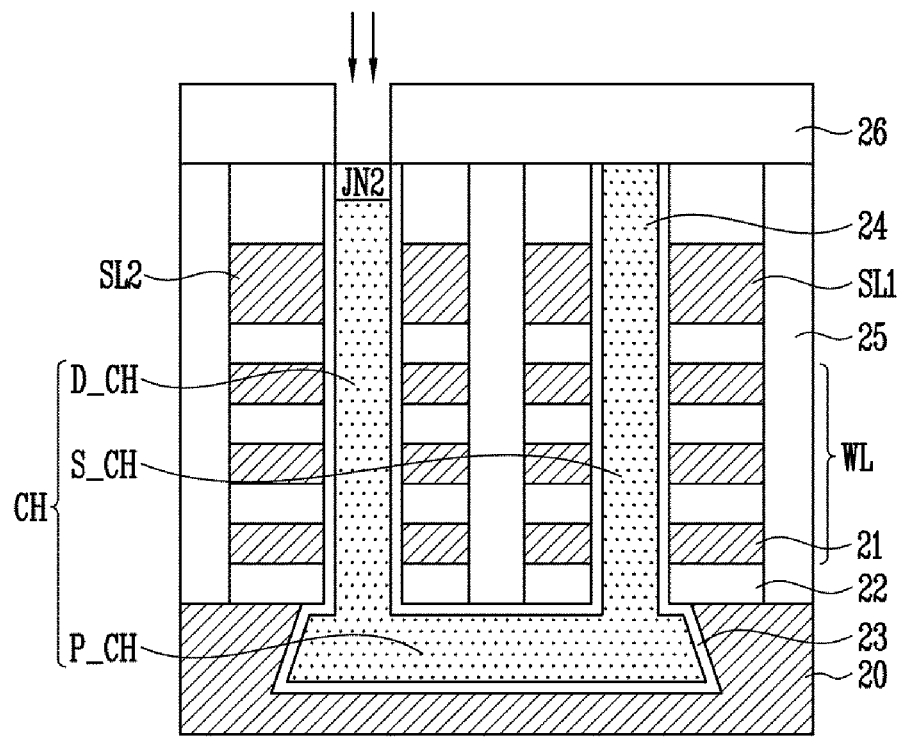
Figure 11C:
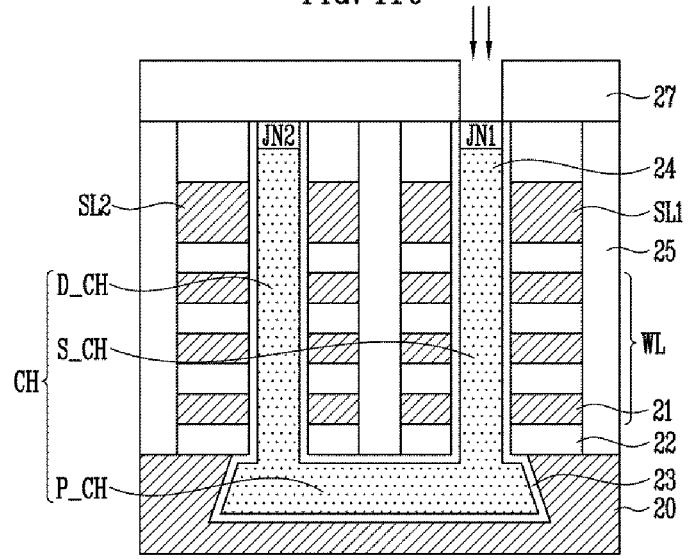

FIGS. 11A to 11C are cross-sectional views illustrating a method of manufacturing a 3-D nonvolatile memory device according to a sixth embodiment of this disclosure.

As shown in FIG. 11A, a channel layer CH configured to include a pipe channel layer P_CH buried in a pipe gate 20 and a pair of a drain-side channel layer D_CH and a source-side channel layer S_CH coupled to the pipe channel layer P_CH, a plurality of memory cells stacked along the channel layer CH, and a select transistor disposed over the plurality of memory cells may be formed.

Although not shown, the plurality of memory cells and the select transistor may be formed using a variety of methods. A process of forming the plurality of memory cells and the select transistor is described below.

After forming a first trench by etching the pipe gate 20, the first trench may be filled with a sacrificial layer. Although not shown, an additional pipe gate may be formed on the pipe gate in which the sacrificial layer may be filled. In this case, cell current can be increased.

A plurality of first material layers 21 and a plurality of second material layers 22 may be alternately formed over the pipe gate in which the sacrificial layer may be filled. The first material layers 21 are used to form a plurality of word lines and one or more select lines, and the second material layers 22 may be used to separate each of the plurality of word lines and the one or more select lines from each other. The first material layer 21 and the second material layer 22 may be made of materials having a high etch selectivity. For example, the first material layer 21 may be formed of a conductive layer or a sacrificial layer for word lines, and the second material layer 22 may be formed of an interlayer insulating layer or a sacrificial layer.

In an embodiment, the first material layer 21 may be formed of a conductive layer for word lines, such as a polysilicon layer, and the second material layer 22 may be formed of an interlayer insulating layer, such as an oxide layer.

In an embodiment, the first material layer 21 may be formed of a doped polysilicon layer for word lines, and the second material layer 22 may be formed of an undoped polysilicon layer or an amorphous silicon layer, that is, a sacrificial layer. The doped polysilicon layer may be a polysilicon layer into which a dopant, such as boron (Br), has been doped. In this case, the second material layers 22 may be recessed after forming a slit, and an interlayer insulating layer, such as an oxide layer, may be filled in the recessed regions, thereby separating the stacked word lines from each other.

In yet another embodiment, the first material layer 21 may be formed of a sacrificial layer, such as a nitride layer, and the second material layer 22 may be formed of an interlayer insulating layer, such as an oxide layer. In this case, the first material layers 21 may be recessed after forming a slit, and a conductive layer, such as a polysilicon layer, a tungsten layer, or a metal layer, may be filled in the recessed regions, thereby forming word lines.

Next, a pair of second trenches coupled to the first trench may be formed by etching the plurality of first material layers 21 and the plurality of second material layers 22. A charge blocking layer, a memory layer, and a tunnel insulating layer, collectively denoted by 23, are sequentially formed on the inner walls of the first and the second trenches. The tunnel insulating layer functions as an energy barrier layer for Fowler-Nordheim (FN) tunneling, and it may be formed of an oxide layer. The memory layer functions to store data by injecting or discharging electric charges, and it may be formed of a nitride layer or nano-dots. Furthermore, the charge blocking layer functions to prevent electric charges, stored in the memory layer, from moving word lines. The charge blocking layer may have a stack structure of an oxide layer, a nitride layer, and an oxide layer, or it may be made of material having a high dielectric constant.

A channel layer 24 may be formed on the tunnel insulating layer. The channel layer 24 may be formed of a polysilicon layer into which an impurity has not been doped. FIG. 11A shows an example in which the channel layer 24 may be formed so that the first trench and the pair of second trenches are fully filled up to the central region of the channel layer 24. As a result, the pipe channel layer P-CH filled in the first trench and the source-side channel layer S_CH and the drain-side channel layer D_CH which are filled in the pair of second trenches may be formed.

Next, a slit may be formed by etching the plurality of first material layers 21 and the plurality of second material layers 22 between the second trenches.

In the case of the first embodiment, the plurality of first material layers 21 exposed to the slit is silicided. For example, after forming a metal layer within the slit, a silicidation layer may be formed through a reaction of the metal layer with the first material layers 21 formed of a polysilicon layer using a thermal treatment process. Next, after removing the remaining metal layer, the insulating layer 24 may be filled within the slit.

In the case of the second embodiment, the plurality of second material layers 22 exposed to the slit may be recessed. An interlayer insulating layer may be filled within the recessed regions of the second material layers 22.

In the case of the third embodiment, the plurality of first material layers 21 exposed to the slit may be recessed. A conductive layer, such as a tungsten layer, may be filled within the recessed regions of the first material layers 21.

As a result, a plurality of memory cells and a select transistor are stacked over the substrate. Additionally, an example in which the plurality of memory cells and the select transistor may be formed at the same time has been described in connection the sixth embodiment. In various embodiments, after forming the plurality of memory cells, the select transistor may be formed by an additional process.

As shown in FIG. 11B, a first mask pattern 26 configured to substantially cover the source-side channel layer S_CH, but to have the drain-side channel layer D_CH exposed there through is formed. An N type impurity may be implanted into the top of the drain-side channel layer D_CH by performing a primary ion implantation process using the first mask pattern 26 as a barrier, thereby forming a second junction JN2. The second junction JN2 may be formed so that the second junction JN2 is overlapped with the gate of the second select line SL2 or separated from the second select line SL2 by controlling the concentration and depth of ions implanted into the drain-side channel layer D_CH through control of the primary ion implantation process.

As shown in FIG. 11C, after removing the first mask pattern 26, a second mask pattern 27 configured to substantially cover the drain-side channel layer D_CH on which the second junction JN2 may be formed, but to have the source-side channel layer S_CH exposed therethrough is formed. A P type impurity may be implanted into the top of the source-side channel layer S_CH by performing a secondary ion implantation process using the second mask pattern 27 as a barrier, thereby forming a first junction JN1. The first junction JN1 may be formed so that the first junction JN1 is overlapped with the gate of the first select line SL1 or separated from the first select line SL1 by controlling the concentration and depth of ions implanted into the source-side channel layer S_CH through control of the secondary ion implantation process.

In various embodiments, after forming the second junction JN2 using the second mask pattern 27, the first junction JN1 may be formed using the first mask pattern 26.

Although not shown, processes of forming the source lines SL and a bit line BL are sequentially performed.

Figure 12A:
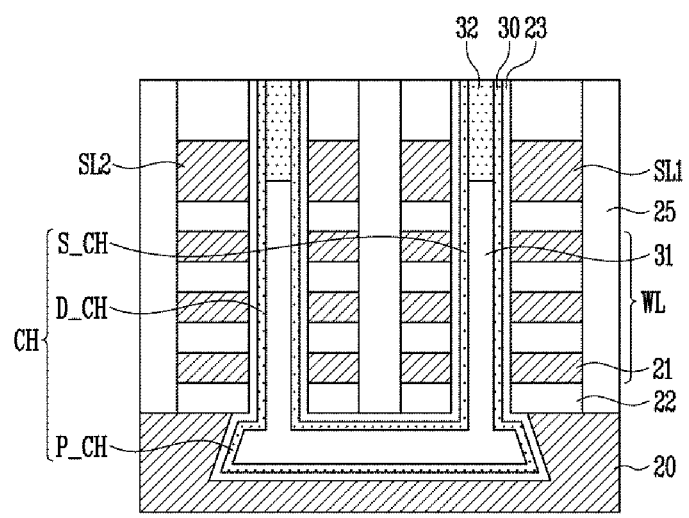
FIGS. 12A to 12C are cross-sectional views illustrating a method of manufacturing a 3-D nonvolatile memory device according to a seventh embodiment of this disclosure.
Figure 12B:
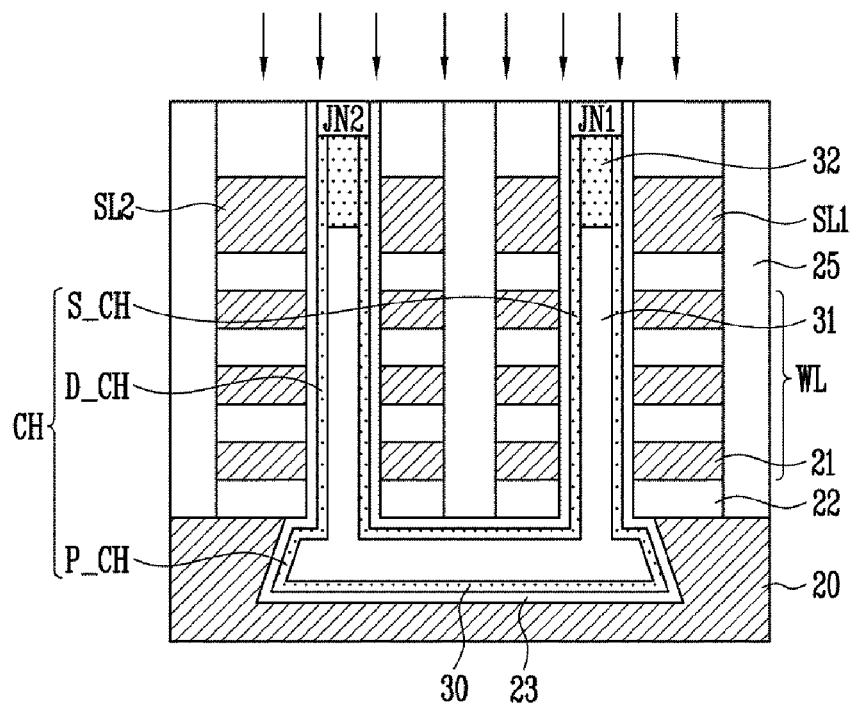
Figure 12C:
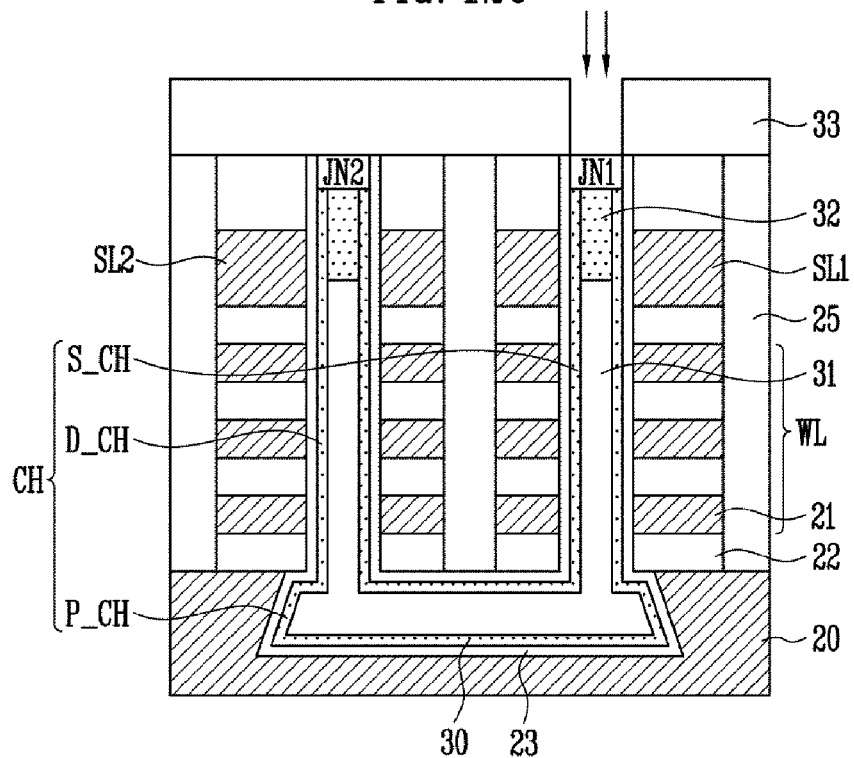

FIGS. 12A to 12C are cross-sectional views illustrating a method of manufacturing a 3-D nonvolatile memory device according to a seventh embodiment of this disclosure.

As shown in FIG. 12A, a channel layer CH, 30 configured to include a pipe channel layer P_CH buried in a pipe gate 20 and a pair of a drain-side channel layer D_CH and a source-side channel layer S_CH coupled to the pipe channel layer P_CH, a plurality of memory cells stacked along the channel layer CH, and a select transistor disposed over the plurality of memory cells may be formed.

The seventh embodiment exemplifies that the channel layer 30 may be formed so that the central region of a first trench and a pair of second trenches is opened. The channel layer 30 may be formed of a polysilicon layer into which an impurity has not been doped. For example, after forming the channel layer 30, an insulating layer 31 may be filled in the opened central region. The insulating layer 31 may be recessed to a specific depth and conductive plugs 32 may be filled in the recessed regions of the insulating layer 31, thereby forming the channel layer CH. The remaining processes may be performed like the processes of the sixth embodiment, and thus a description thereof is omitted.

As shown in FIG. 12B, a primary ion implantation process for implanting an N type impurity is performed. Here, the N type impurity may be implanted into the conductive plugs 32 and the channel layer 30, thereby forming a first junction JN1 and second junction JN2 of an N type.

An example in which the primary ion implantation process is performed without using a mask pattern has been described in the present embodiment. In various embodiments, after forming a mask pattern through which the conductive plugs 32 and the source-side channel layer S_CH and the drain-side channel layer D_CH that substantially surround the conductive plugs 32 are exposed, the primary ion implantation process may be performed using the mask pattern as a barrier.

As shown in FIG. 12C, a mask pattern 33 configured to substantially cover the second junction JN2, but to have the first junction JN1 exposed therethrough is formed. A secondary ion implantation process for implanting a P type impurity is performed using the mask pattern 33 as a barrier. Here, the P type impurity is sufficiently implanted into the first junction JN1 so that the first junction JN1 has a P type.

In various embodiments, after implanting the P type impurity in the primary ion implantation process, an N type impurity may be implanted using another mask pattern configured to substantially cover the first junction JN1, but to have the second junction JN2 exposed there through in a secondary ion implantation process.

Although not shown, processes of forming a source line SL and a bit line BL may be sequentially performed.

Figure 13A:
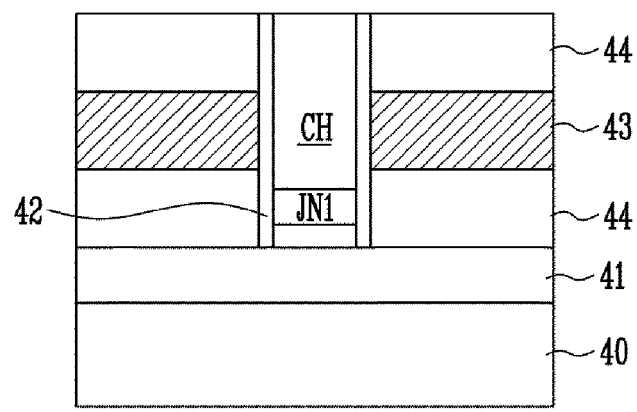
FIGS. 13A and 13B are cross-sectional views illustrating a method of manufacturing a 3-D nonvolatile memory device according to an eighth embodiment of this disclosure.
Figure 13B:
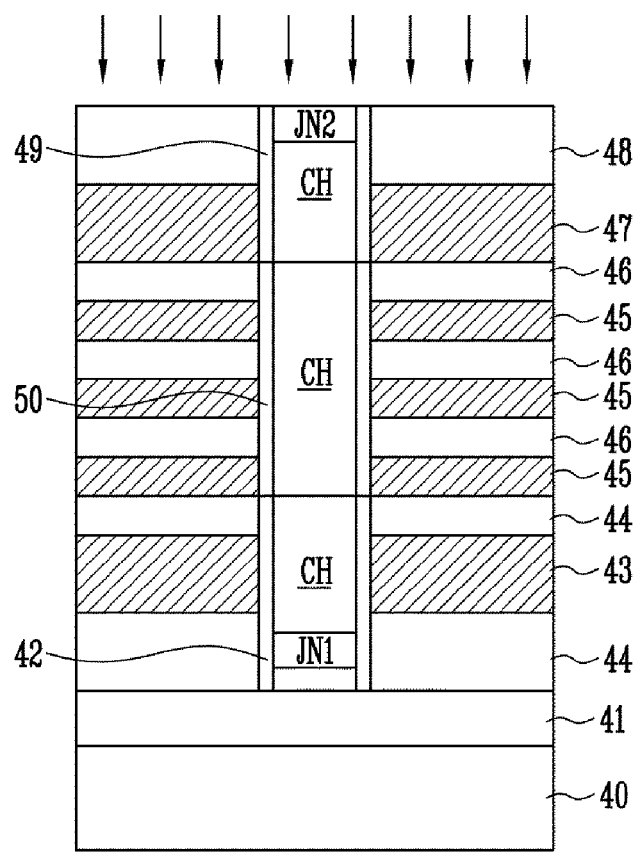

FIGS. 13A and 13B are cross-sectional views illustrating a method of manufacturing a 3-D nonvolatile memory device according to an eighth embodiment of this disclosure.

As shown in FIG. 13A, a first junction JN1 and a lower select transistor may be formed over a substrate 40 on which a source region 41 may be formed. The first junction JN1 is interposed between the source region 41 and the lower select transistor. The first junction JN1 may be overlapped with or separated from the gate of the lower select transistor.

For example, after alternately forming a plurality of interlayer insulating layers 44 and at least one conductive layer 43 over the substrate 40, a trench may be formed by etching the plurality of interlayer insulating layers 44 and the at least one conductive layer 43. A gate insulating layer 42 may be formed on the inner wall of the trench. A conductive layer, such as a polysilicon layer, may be formed within the trench on which the gate insulating layer 42 may be formed. Next, a P type impurity may be implanted into the conductive layer by performing a primary ion implantation process. The first junction JN1 may be formed by recessing the conductive layer. Here, the first junction JN1 may be overlapped with or separated from the gate of the lower select transistor depending on the recessed depth of the conductive layer. Next, a channel layer CH may be filled within the trench in which the first junction JN1 has been formed.

An example in which the primary ion implantation process is performed without using a mask pattern has been described above. In various embodiments, the primary ion implantation process may be performed using a mask pattern through which the conductive layer is exposed as a barrier.

As shown in FIG. 13B, a plurality of interlayer insulating layers 46 and a plurality of conductive layers 45 are alternately formed on the results in which the first junction JN1 and the lower select transistor may be formed. A trench may be formed by etching the plurality of interlayer insulating layers 46 and the plurality of conductive layers 45. A charge blocking layer, a memory layer, and a tunnel insulating layer, collectively denoted by 50, may be formed on the inner wall of the trench. A channel layer CH may be formed on the tunnel insulating layer. As a result, a plurality of memory cells may be formed.

A plurality of interlayer insulating layers 48 and at least one conductive layer 47 may be formed on the results in which the plurality of memory cells has been formed. A trench may be formed by etching the plurality of interlayer insulating layers 48 and the at least one conductive layer 47. A gate insulating layer 49 may be formed on the inner wall of the trench. A channel layer CH may be formed on the gate insulating layer 49. As a result, an upper select transistor may be formed.

An N type impurity may be implanted into the top of the channel layer CH of the upper select transistor by performing a secondary ion implantation process, thereby forming a second junction JN2 of an N type. An example in which the secondary ion implantation process is performed without using a mask pattern has been described above. In various embodiments, the secondary ion implantation process may be performed using a mask pattern through which the channel layer CH is exposed as a barrier.

Although not shown, processes of forming a source line SL and a bit line BL are sequentially performed.

Additionally, an example in which the first junction JN1 may be formed while forming the lower select transistor has been described in the eighth embodiment. In various embodiments, after forming the first junction JN1, the lower select transistor may be formed.

Figure 14:
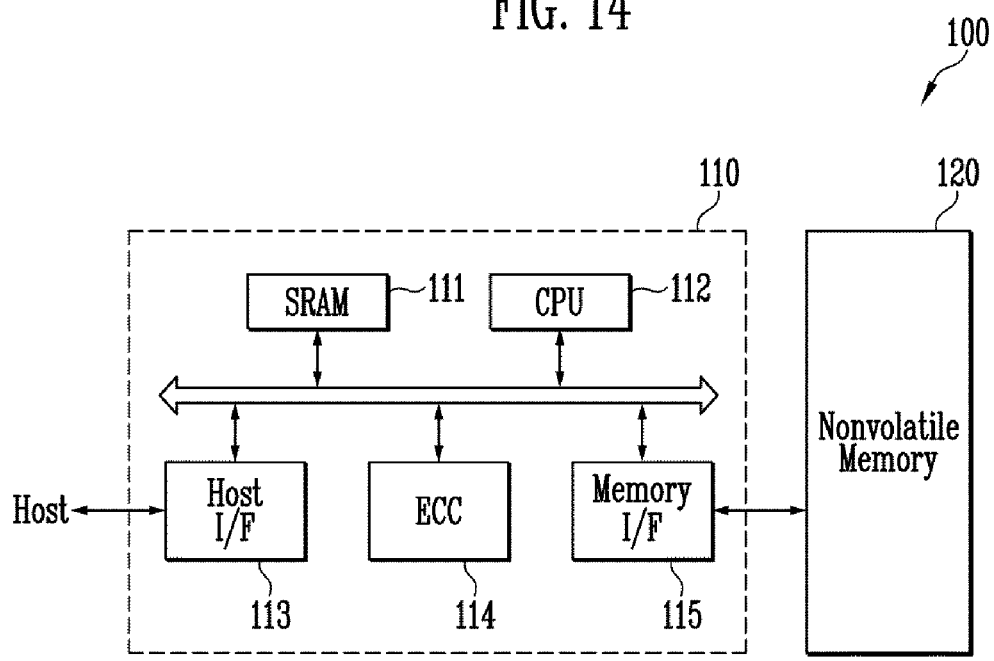
FIG. 14 shows the construction of a memory system according to an embodiment of this disclosure.

FIG. 14 shows the construction of a memory system according to an embodiment of this disclosure.

As shown in FIG. 14, the memory system 100 according to the exemplary embodiment of this disclosure may include a nonvolatile memory device 120 and a memory controller 110.

The nonvolatile memory device 120 may be formed to have a structure according to the above-described layout. In various embodiments, the nonvolatile memory device 120 may be a multi-chip package including a plurality of flash memory chips.

The memory controller 110 may be configured to control the nonvolatile memory device 120, and it may include SRAM 111, a central processing unit (CPU) 112, a host interface (I/F) 113, an error correction code (ECC) circuit 114, and a memory interface (I/F) 115. The SRAM 111 may be used as the operating memory of the CPU 112. The CPU 112 performs an overall control operation for the data exchange of the memory controller 110. The host I/F 113 is equipped with the data exchange protocol of a host that accesses the memory system 100. Furthermore, the ECC circuit 114 circuit detects and corrects errors included in data read from the nonvolatile memory device 120. The memory I/F 115 performs an interface with the nonvolatile memory device 120. The memory controller 110 may further include RCM for storing code data for an interface with the host.

The memory system 100 configured as described above may be a memory card or a solid state disk (SSD) in which the nonvolatile memory device 120 and the controller 110 are combined. For example, if the memory system 100 is an SSD, the memory controller 110 may communicate with the outside (for example, a host) through one of various interface protocols, such as a USB, MMC, PCI-E, SATA, PATA, SCSI, ESDI, and IDE.

Figure 15:
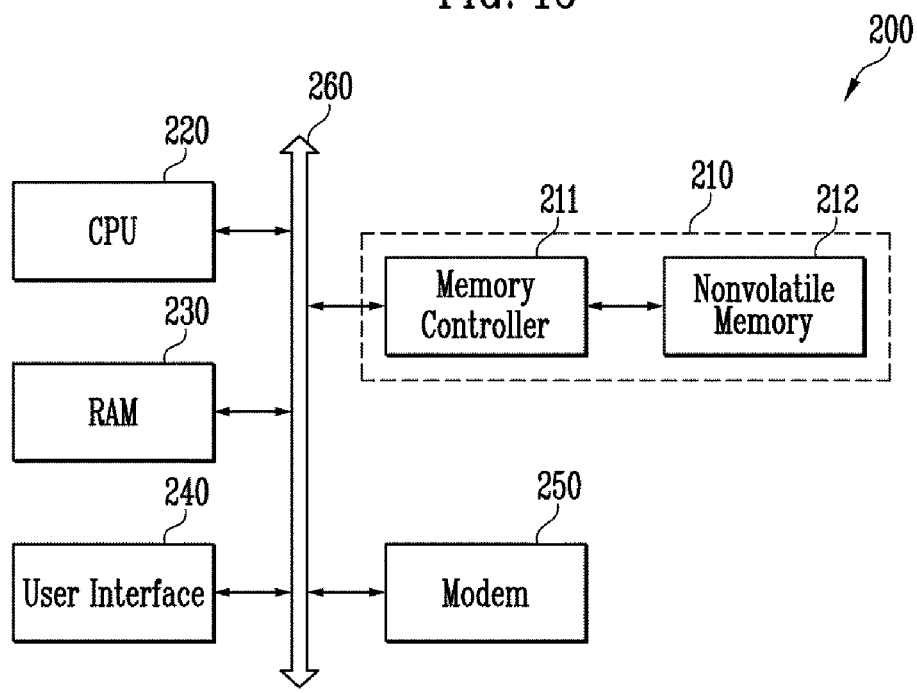
FIG. 15 shows the construction of a computing system according to an embodiment of this disclosure.

FIG. 15 shows the construction of a computing system according to an embodiment of this disclosure.

As shown in FIG. 15, the computing system 200 according to an embodiment of this disclosure may include a CPU 220, RAM 230, a user interface 240, a modem 250, and a memory system 210 all of which are electrically coupled to a system bus 260. If the computing system 200 is a mobile device, the computing system 200 may further include a battery for supplying operating voltages to the computing system 200. The computing system 200 may further include application chipsets, a camera image processor (CIS), mobile DRAM, and so on.

The memory system 210 may include a nonvolatile memory device 212 and a memory controller 211 as described above with reference to shown in FIG. 14.

In accordance with this disclosure, when an erase operation is performed, a sufficient number of holes can be stably supplied from the junction to the channel layer. Furthermore, a read operation can be performed by easily sensing a rise in the level of a bit line.

What is claimed is:

1. A three-dimensional (3-D) nonvolatile memory device, comprising:
   a channel layer protruded from a substrate;
   a plurality of memory cells stacked along the channel layer;
   a source line coupled to an end of one side of the channel layer;
   a bit line coupled to an end of an other side of the channel layer;
   a first junction interposed between the end of one side of the channel layer and the source line and configured to have a P type impurity doped therein; and
   a second junction interposed between the end of the other side of the channel layer and the bit line and configured to have an N type impurity doped therein,
   wherein the first junction and the plurality of memory cells are disposed at different levels.

2. The 3-D nonvolatile memory device of claim 1, further comprising a third junction interposed between the end of one side of the channel layer and the first junction and configured to have an N type impurity doped therein.

3. The 3-D nonvolatile memory device of claim 1, further comprising:
   at least one first select transistor interposed between the first junction and a memory cell formed at the end of one side of the channel layer, from among the plurality of memory cells; and
   at least one second select transistor interposed between the second junction and a memory cell formed at the end of the other side of the channel layer, from among the plurality of memory cells.

4. The 3-D nonvolatile memory device of claim 3, wherein when a read operation is performed, whether a voltage level of the bit line is higher than a precharge voltage or not is sensed by applying the precharge voltage to the bit line, floating the bit line, and applying voltage higher than the precharge voltage to the source line.

5. The 3-D nonvolatile memory device of claim 3, wherein when a program operation is performed, the first select transistor is turned off and the second select transistor is turned on by applied an operating voltage to the second select transistor.

6. The 3-D nonvolatile memory device of claim 3, wherein when an erase operation is performed, gates of the first select transistor and the second select transistor are floated and an erase voltage is applied to the source line so that holes are supplied from the first junction to the channel layer.

7. The 3-D nonvolatile memory device of claim 1, wherein the channel layer is formed of an undoped polysilicon layer.

8. The 3-D nonvolatile memory device of claim 1, wherein the channel layer comprises:
   a pipe channel layer formed in a pipe gate; and
   a pair of a source-side channel layer and a drain-side channel layer coupled to the pipe channel layer and protruded from the pipe gate.

9. The 3-D nonvolatile memory device of claim 8, wherein the channel layer is formed substantially in a U form.

10. A method of manufacturing a three-dimensional (3-D) nonvolatile memory device, the method comprising:
    forming a plurality of memory cells that are stacked along a channel layer protruded from a substrate;
    forming a first junction coupled to an end of one side of the channel layer and configured to have a P type impurity doped therein;
    forming a second junction coupled to an end of an other side of the channel layer and configured to have an N type impurity doped therein;
    forming a source line coupled to the first junction; and
    forming a bit line coupled to the second junction,
    wherein the first junction and the plurality of memory cells are disposed at different levels.

11. The method of claim 10, wherein the channel layer comprises:
    a pipe channel layer formed in a pipe gate; and a pair of a source-side channel layer and a drain-side channel layer coupled to the pipe channel layer and protruded from the pipe gate.

12. The method of claim 11, wherein the channel layer is formed substantially in a U form.

13. The method of claim 11, wherein forming the second junction comprises:
    forming a first mask pattern through which a drain-side channel layer is exposed; and
    implanting an N type impurity into the drain-side channel layer using the first mask pattern as a barrier.

14. The method of claim 11, wherein forming the first junction comprises:
    forming a second mask pattern through which a source-side channel layer is exposed; and
    implanting a P type impurity into the source-side channel layer using the second mask pattern as a barrier.

15. The method of claim 11, wherein forming the first junction and forming the second junction comprises:
    implanting a first type impurity into the drain-side channel layer and the source-side channel layer by performing a primary ion implantation process;
    forming a mask pattern through which the drain-side channel layer or the source-side channel layer is exposed; and
    implanting a second type impurity into the drain-side channel layer or the source-side channel layer using the mask pattern as a barrier by performing a secondary ion implantation.

16. The method of claim 10, wherein forming the plurality of memory cells comprises:
    alternately forming first material layers and second material layers;
    forming first trenches by etching the first material layers and the second material layers; and
    forming the channel layer in the pair of first trenches.

17. The method of claim 16, further comprising:
    forming a second trench at a position where a pair of first trenches is coupled by etching a pipe gate, before alternately forming the first material layers and the second material layers; and
    filling the second trench with a sacrificial layer.

18. The method of claim 16, further comprising:
    forming a slit between the first trenches by etching the first material layers and the second material layers, after forming the channel layer;
    recessing the second material layers exposed to the slit; and
    forming a conductive layer or an interlayer insulating layer in the recessed regions of the second material layers.

* * * * *